US011239199B2

(12) United States Patent
Seidemann et al.

(10) Patent No.: US 11,239,199 B2
(45) Date of Patent: Feb. 1, 2022

(54) PACKAGE STACKING USING CHIP TO WAFER BONDING

(71) Applicant: Intel Corporation, Santa Clara, CA (US)

(72) Inventors: Georg Seidemann, Landshut (DE); Klaus Reingruber, Langquaid (DE); Christian Geissler, Teugn (DE); Sven Albers, Regensburg (DE); Andreas Wolter, Regensburg (DE); Marc Dittes, Regensburg (DE); Richard Patten, Langquaid (DE)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 15/774,906

(22) PCT Filed: Dec. 26, 2015

(86) PCT No.: PCT/US2015/000394
§ 371 (c)(1),
(2) Date: May 9, 2018

(87) PCT Pub. No.: WO2017/111836
PCT Pub. Date: Jun. 29, 2017

(65) Prior Publication Data
US 2018/0331070 A1 Nov. 15, 2018

(51) Int. Cl.
*H01L 23/48* (2006.01)
*H01L 23/52* (2006.01)
(Continued)

(52) U.S. Cl.
CPC ........ *H01L 25/0657* (2013.01); *H01L 21/486* (2013.01); *H01L 23/3107* (2013.01);
(Continued)

(58) Field of Classification Search
CPC ... H01L 21/486; H01L 23/3107; H01L 23/48; H01L 23/49827; H01L 23/5384;
(Continued)

(56) References Cited

U.S. PATENT DOCUMENTS

2010/0283160 A1 11/2010 Chandrasekaran
2012/0171814 A1* 7/2012 Choi .................. H01L 23/3128
438/107

(Continued)

OTHER PUBLICATIONS

International Search Report and Written Opinion for International Patent Application No. PCT/US2015/000394 dated Oct. 12, 2016, 14 pgs.
(Continued)

*Primary Examiner* — Jami Valentine Miller
*Assistant Examiner* — Dilinh P Nguyen
(74) *Attorney, Agent, or Firm* — Schwabe, Williamson & Wyatt, P.C.

(57) ABSTRACT

Embodiments are generally directed to package stacking using chip to wafer bonding. An embodiment of a device includes a first stacked layer including one or more semiconductor dies, components or both, the first stacked layer further including a first dielectric layer, the first stacked layer being thinned to a first thickness; and a second stacked layer of one or more semiconductor dies, components, or both, the second stacked layer further including a second dielectric layer, the second stacked layer being fabricated on the first stacked layer.

18 Claims, 9 Drawing Sheets

(51) Int. Cl.
*H01L 25/065* (2006.01)
*H01L 23/00* (2006.01)
*H01L 25/00* (2006.01)
*H01L 23/498* (2006.01)
*H01L 21/48* (2006.01)
*H01L 23/31* (2006.01)
*H01L 23/538* (2006.01)
*H01L 21/56* (2006.01)

(52) U.S. Cl.
CPC ........ *H01L 23/48* (2013.01); *H01L 23/49827* (2013.01); *H01L 23/5384* (2013.01); *H01L 24/19* (2013.01); *H01L 24/20* (2013.01); *H01L 24/25* (2013.01); *H01L 24/81* (2013.01); *H01L 24/96* (2013.01); *H01L 24/97* (2013.01); *H01L 25/0652* (2013.01); *H01L 25/50* (2013.01); *H01L 21/561* (2013.01); *H01L 21/568* (2013.01); *H01L 23/3135* (2013.01); *H01L 23/49816* (2013.01); *H01L 23/5389* (2013.01); *H01L 2224/04105* (2013.01); *H01L 2224/12105* (2013.01); *H01L 2224/16235* (2013.01); *H01L 2224/16238* (2013.01); *H01L 2224/2518* (2013.01); *H01L 2224/73259* (2013.01); *H01L 2224/81005* (2013.01); *H01L 2224/92224* (2013.01); *H01L 2224/97* (2013.01); *H01L 2225/06524* (2013.01); *H01L 2225/06541* (2013.01); *H01L 2225/06548* (2013.01); *H01L 2924/15311* (2013.01); *H01L 2924/18161* (2013.01); *H01L 2924/3511* (2013.01)

(58) Field of Classification Search
CPC ......... H01L 24/19; H01L 24/20; H01L 24/25; H01L 24/81; H01L 24/96; H01L 24/97; H01L 25/0652; H01L 25/50; H01L 25/117; H01L 25/043; H01L 25/0657; H01L 25/074; H01L 25/0756; H01L 27/3209; H01L 31/048; H01L 33/52; H01L 21/56; H01L 23/28; H01L 23/3135; H01L 23/3192; H01L 2224/16055
USPC ................................ 257/738, 685, 777, 790
See application file for complete search history.

(56) References Cited

U.S. PATENT DOCUMENTS

| | | | | |
|---|---|---|---|---|
| 2013/0105991 | A1* | 5/2013 | Gan | ...................... H01L 25/105 257/777 |
| 2014/0151900 | A1* | 6/2014 | Hu | ...................... H01L 25/0657 257/774 |
| 2015/0008580 | A1 | 1/2015 | Joh | |
| 2015/0279818 | A1* | 10/2015 | Hsu | ........................ H01L 24/19 257/737 |
| 2017/0125379 | A1* | 5/2017 | Chen | ...................... H01L 25/50 |

OTHER PUBLICATIONS

International Preliminary Report on Patentablity for International Patent Application No. PCT/US2015/000394, dated Jul. 5, 2018, 10 pages.
Office Action from Taiwan Patent Application No. 105138822, dated Jan. 16, 2020, 11pgs.
Office Action from Taiwan Patent Application No. 105138822, dated Sep. 9, 2020, 13 pgs.
Office Action from Taiwan Patent Application No. 105138822, dated Apr. 16, 2021, 10 pgs.
Office Action from Taiwan Patent Application No. 105138822, dated Jul. 19, 2021, 3 pgs., no translation.
Notice of Allowance from Taiwan Patent Application No. 105138822, dated Oct. 26, 2021, 3 pgs.

* cited by examiner

PACKAGE STACKING USING CHIP TO WAFER BONDING

CROSS-REFERENCE TO RELATED APPLICATION

This patent application is a U.S. National Phase Application under 35 U.S.C. § 371 of International Application No. PCT/US2015/000394, filed Dec. 26, 2015, entitled "PACKAGE STACKING USING CHIP TO WAFER BONDING," which designates the United States of America, the entire disclosure of which is hereby incorporated by reference in its entirety and for all purposes.

TECHNICAL FIELD

Embodiments described herein generally relate to the field of electronic devices and, more particularly, to package stacking using chip to wafer bonding.

BACKGROUND

In the development of new mobile application, while cost remains the main driving factor in development, the height of stacked packages has become an increasingly important element. In order to fit elements within thinner mobile phones or other mobile devices or to fit such elements at new positions within a mobile device (such as under a battery, in a double sided assembly of a board, etc.), thin package on package (PoP) or staged chip solutions are important future system integration applications.

In conventional fabrication of device, in order to build up thinned stacked dies, packages, or components, each part can be thinned before stacking, or alternatively the stacked package can be thinned.

The handling of very thin dies or packages in fabrication is very difficult due to the warpage and stiffness behavior of these elements, and thus fabrication generally requires additional processes and tools, such as Thermal Compression with Non-Conductive Paste (TCNCP) to address capillary underfill process and molded underfill process.

However, these types of processes add complexity to fabrication, and the potential yield loss due to handling problems with thin dies can significantly increase the cost of device fabrication.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1A:
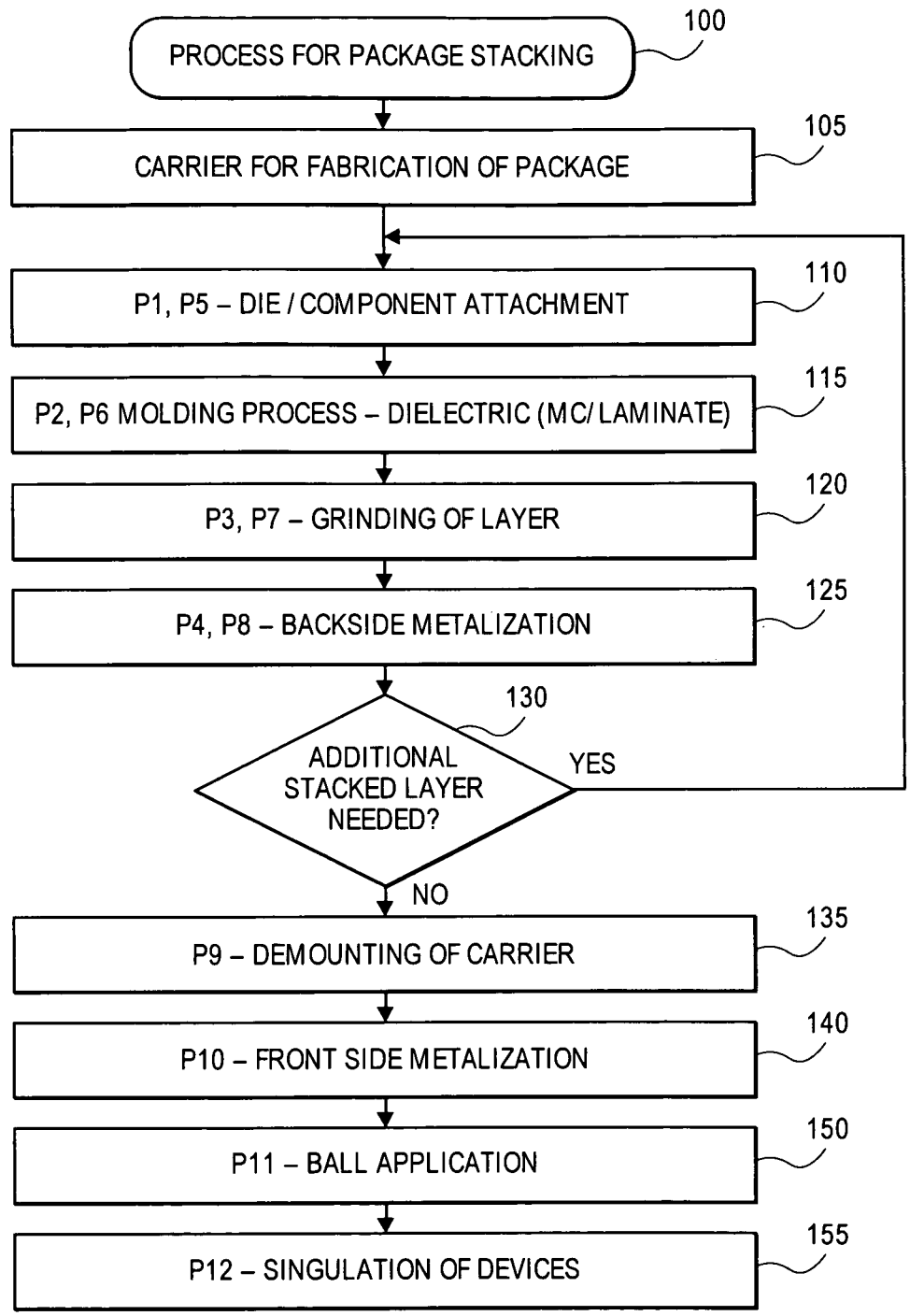
FIG. 1A is a flowchart to illustrate a process for fabrication of a stacked package using chip to wafer bonding.

Embodiments described herein are generally directed to package stacking using chip to wafer bonding.

In some embodiments, an apparatus, system, or process provides for package stacking using chip to wafer bonding. In some embodiments, the process provides for stacking of two or more package levels with single and multi-die arrangements using chip to wafer bonding. In some embodiments, the process is not limited in the number of layers within the stack, and may continue as needed with additional layers in the stack.

In some embodiments, one or more components, which may include semiconductor dies (chips), components, or both (generally referred to herein as dies and components) are applied to a carrier together with a dielectric material (which may include mold compound, laminate, or other dielectric material) in a process (referred to herein generally as a molding process) to generate a reconstituted element that is artificially generated by the molding process. A reconstituted element is generally referred to herein as a "reconstitution wafer". However, embodiments are not limited to a particular wafer or other shape. In some embodiments, the reconstitution wafer is bonded to the carrier and thinned to a final thickness to expose the embedded dies and components.

In some embodiments, a capillary underfill may optionally be applied before embedding of a carrier, wherein a capillary underfill process is used to encapsulate the bottom side of a silicon die. In some embodiments, a process may alternatively use different dielectric materials for different layers. For example, because of the avoidance of thin die handling in an embodiment, a polyimide may be used for the lower layers (instead of a mold compound or laminate), with only a last layer being molded using a mold compound or laminate to provide stability for the overall package.

In some embodiments, back side contacts are formed on the thinned reconstitution wafer and a next layer of dies and components are attached face down to these back side contacts, utilizing a chip to wafer bonding process. In some embodiments, the second layer of dies and components are then embedded in the molding process (with mold compound, laminate, or other dielectric material) and exposed by thinning.

In some embodiments, a process sequence from forming back side contacts to thinning of the wafer can be repeated as many times as needed to stack as many layers as needed into the resulting device, where such process sequence occurs without demounting of the carrier, thus providing stability throughout the fabrication process.

In some embodiments, a process thus provides for thinning of parts of a stacked package that are already mounted onto a carrier, and building up follow up layers (including back side RDL if needed) onto the built up and thinned reconstitution wafer.

In some embodiments, by maintaining the different dies and components within a reconstitution wafer and without demounting of the carrier, the single silicon dies and components are not handled as thin dies, and therefore the possible warpage of the single dies due to thinning is not an issue in the process. In some embodiments, package stacking using chip to wafer bonding may be utilized to build up very thin package stacks while minimizing warpage and handling issues resulting from convention processes for handling thin wafers or chips. With this process, a very thin stacking height can be achieved for a particular device.

In some embodiments, due to the production process of stacking and thinning such that each layer of components has a same height as the surrounding dielectric (such as mold compound or laminate), a stacked apparatus may be generated in which there is no significant tilt between the different layers of the package, with all layers being parallel. Due to the parallel processing of many packages within a reconstitution wafer the final singulation process of the packages thus may utilize a single straight sawing operation as there no stepped joints between the different layers of mold compound or laminate along the outer edge of the package.

In some embodiments, a chip to wafer fabrication apparatus or process provides the following:

(1) Because a reconstitution wafer is not demounted from the carrier prior to the final die attach and final thinning process (if a final thinning is needed), issues of warpage in die handling and thinning during the process flow are not faced. The handling of thin dies and die to die attachment is avoided, and mass reflow can be used for attachment of dies to the reconstituted wafer on the carrier. Due to the carrier bonding, dies and components can be thinned to a minimum potential thickness and at the same time be handled as a thick wafer, with the final stability being built up by addition of the single layers.

(2) In some embodiments, at each layer multiple dies and components with multiple different widths and heights can be combined, wherein different heights within a layer are equalized by the thinning process.

(3) Different die sizes may be stacked on top of each other, with the generation of each layer of the reconstitution wafer creating a uniform width for the overall stacked package.

(4) For a multiple package layer stacked SiP (system in package), the side by side arrangement can be different at each layer through optional utilization of back side metallization redistribution layers (RDLs) between the layers of the stack.

(5) Further, lateral RDLs can be realized at each die layer at the stacked package.

(6) There are no limitations in the number of layers in a stack (two-level, three-level, and up) other than practical limitations in a particular implementation.

(7) An embodiment of an apparatus or process may utilize standard fabrication processes and tools. In some embodiments, die to reconstitution wafer connections can be built by solder bumps or Cu-pillar bumps. Further, connections through the layers of a stacked package can be built utilizing through mold vias (TMVs) or through silicon vias (TSVs).

(8) Intermediate and final thickness of a device is limited only by grinding tool tolerance and similar factors, and not the handling of thin dies.

(9) An embodiment of an apparatus or process may utilize molding compound or laminate as a dielectric. However, embodiments are not limited to such materials.

In some embodiments, a device includes a first stacked layer including one or more semiconductor dies, components, or both, the first stacked layer further including a first dielectric layer, the first stacked layer being thinned to a first thickness; an optional metallization layer formed on a back side of the first stacked layer after the thinning of the first stacked layer; back side contacts on the back side of the first stacked layer; and a second stacked layer of one or more semiconductor dies, components or both, the second stacked layer further including a second dielectric layer, the second stacked layer being thinned to second thickness, the second stacked layer being fabricated on the back side contacts formed on the first stacked layer, wherein the first stacked layer and the second stacked layer are each fabricated while a carrier is mounted to a front side of the first stacked layer.

In some embodiments, a method includes attaching one or more dies and components in a first stacked layer, a carrier being mounted to a front side of the first stacked layer; molding a first dielectric layer over the one or more dies and components of the first stacked layer; thinning the first stacked layer to a first thickness; forming a metallization layer on a back side of the first stacked layer; attaching one or more dies and components in a second stacked layer, the one or more dies and components being attached to the metallization layer; molding a second dielectric layer over the one or more dies and components of the second stacked layer; thinning the second stacked layer to a second thickness, wherein the first stacked layer and the second stacked layer are each fabricated while the carrier is mounted to the front side of the first stacked layer.

FIG. 1A is a flowchart to illustrate a process for fabrication of a stacked package using chip to wafer bonding. In some embodiments, a process for package stacking 100 includes the following:

105: Placement and bonding of carrier for fabrication of the stacked package.

110—Process P1 (process P5 for second layer): Attachment of semiconductor dies (such as silicon dies) and components onto the carrier for the first layer, or onto the metallization for the previous layer for second and subsequent layers. In some embodiments, the attachment of dies and components may include the attachment of interconnections between layers, providing electrical contact in the Z-direction (perpendicular to the layers of the stacked package), wherein the interconnections may include interconnections passing through the semiconductor dies (through silicon vias (TSVs)) or interconnections that are beside or between the semiconductor dies through the molded dielectric material (which may be referred to as though mold vias or via bars).

In some embodiments, prior to process P1, a process may further include attachment of a common wafer onto the carrier, wherein a reconstitution wafer is built onto such attached wafer.

115—Process P2 (process P6 for second layer): Molding process including application of dielectric material (including, but not limited to, molding compound or laminate) over the semiconductor dies and components of the current layer to generate a reconstitution wafer, or to add a stacked layer to the reconstitution wafer.

In some embodiments, the reconstitution wafer will stay attached to the carrier during the fabrication process using any known technology, such as utilizing an electrostatic chuck (e-chuck), suction, an adhesive or adhesive foil (including an adhesive designed for easy debonding that may, for example, lose its adhesive strength upon applying elevated temperature or UV-radiation), or any other manner of mounting a wafer onto a carrier or other bottom layer.

120—Process P3 (process P7 for second layer): Grinding of dielectric material, semiconductor dies, and components of the current layer to thin the current stacked layer of the reconstitution wafer to a final thickness.

125—Process P4 (process P8 for second layer): In some embodiments, application of back side metallization of the current thinned layer.

130: If an additional stacked layer is to be added 130, the process is to proceed to Process P5 for the attachment of semiconductor dies and components for the additional stacked layer.

If there is not an additional stacked layer is to be added 130, the process proceeds to:

135—Process P9: Demounting of the carrier from the reconstitution wafer.

140—Process P10: Front side metallization of the reconstitution wafer.

145—Process P11: Ball grid array or similar application to the front side metallization of the reconstitution wafer.

150—Process P12: In some embodiments, a process may further include singulation of the stacked package into multiple devices.

Figure 1B:
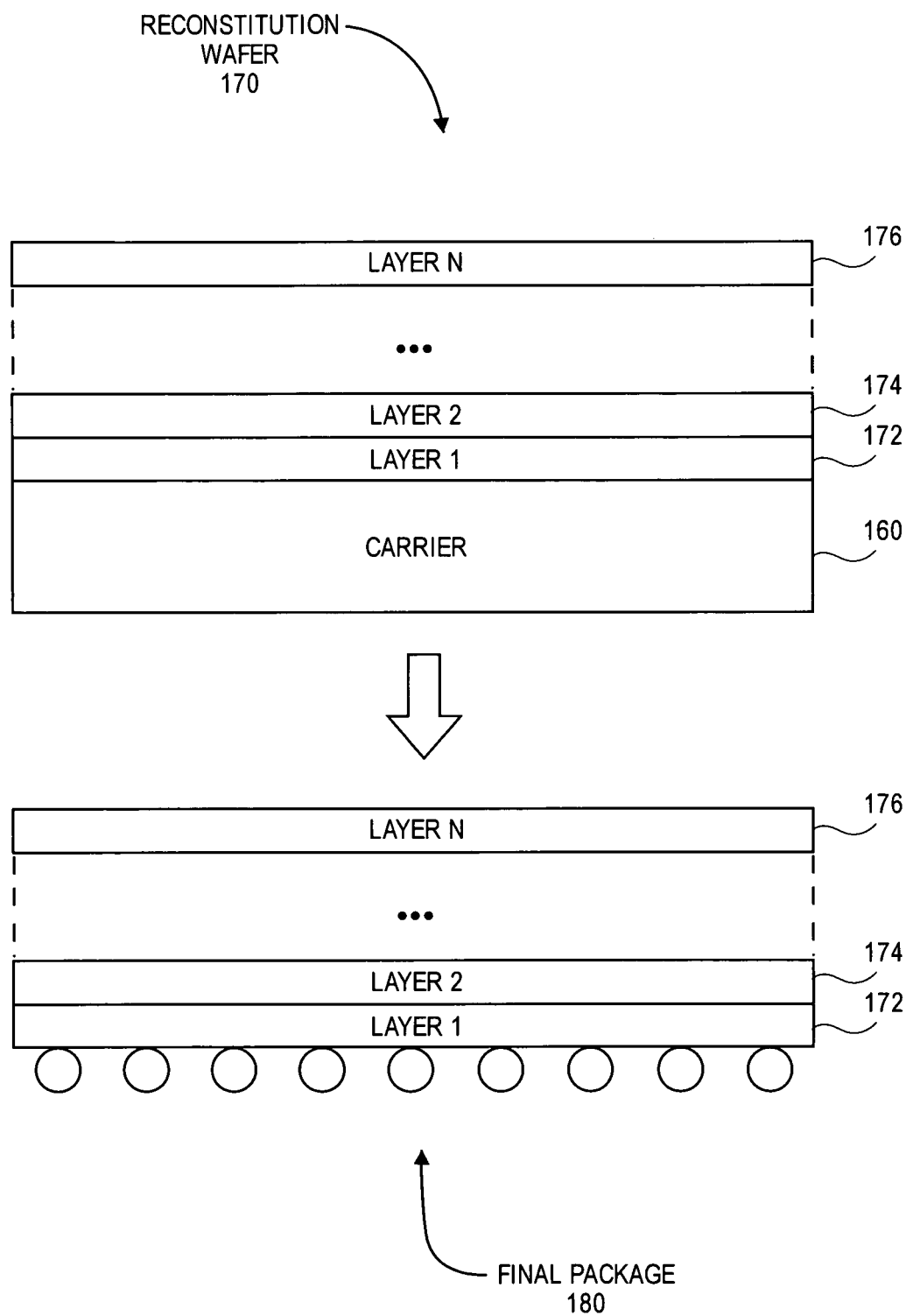
FIG. 1B is an illustration of a stacked package according to an embodiment.

FIG. 1B is an illustration of a stacked package according to an embodiment. In some embodiments, pursuant to the processes illustrated in FIG. 1A, a reconstitution wafer 170 includes a stack of thinned layers, illustrated as Layer 1 (172), Layer 2 (174), and continuing through Lay n (176), where each layer in sequence is built up with the attachment of semiconductor dies and components, molded with a dielectric, thinned by a grinding process, and receives a back side metallization (FIG. 1A, 110-115), while remaining bonded to carrier 160. In some embodiments, the stacked layers of the reconstitution wafer are then further processed by the demounting of the carrier, application of front side metallization, a ball grid array or other application, and singulation to generate one or more final packages 180. (FIG. 1A, elements 135-155)

The processes and apparatuses illustrated in FIGS. 1A and 1B are further illustrated in FIGS. 2 through 9.

Figure 2:
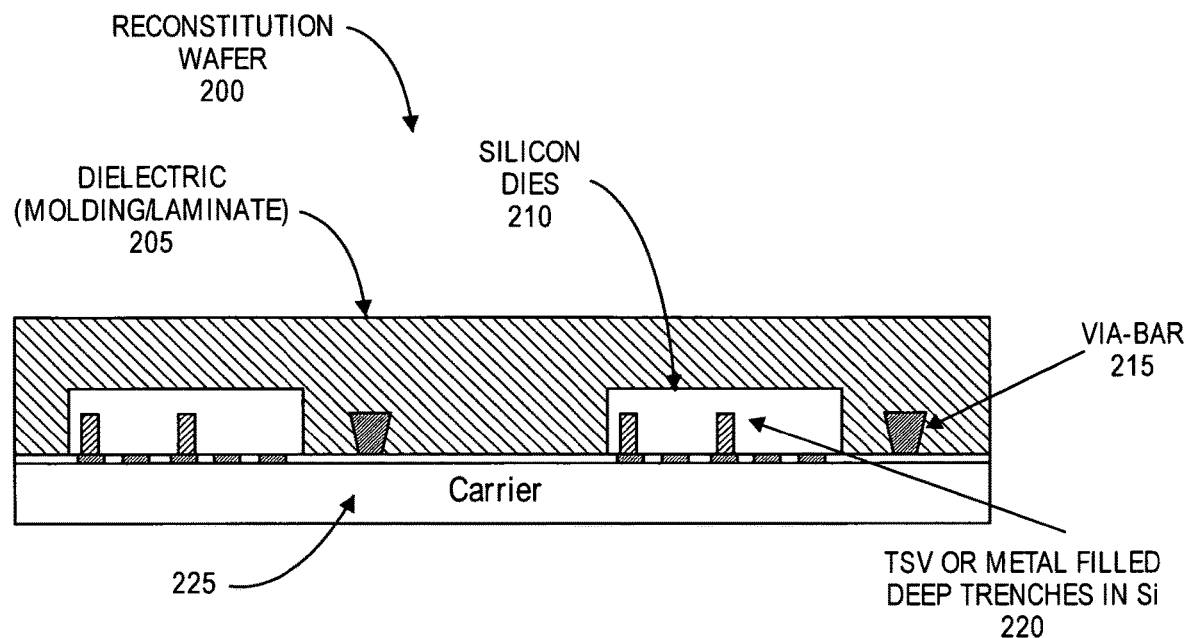
FIG. 2 is an illustration of a reconstitution wafer according to an embodiment.

FIG. 2 is an illustration of a reconstitution wafer according to an embodiment. In some embodiments of an apparatus or process, a carrier 225 is provided for the fabrication of a reconstitution wafer. In some embodiments, a reconstitution wafer 200 is fabricated with implemented silicon dies and components 210, which may optionally include implementation of one or more via bars 215 and one or more through silicon vias or metal filled deep trenches 220.

In some embodiments, the reconstitution wafer 200 is molded with a dielectric (which may include, but is not limited to, a molding compound or laminate) over the silicon dies and components 210, including any via bars 215. For example, see FIG. 1, processes P1 and P2 in elements 110 and 115.

Figure 3:
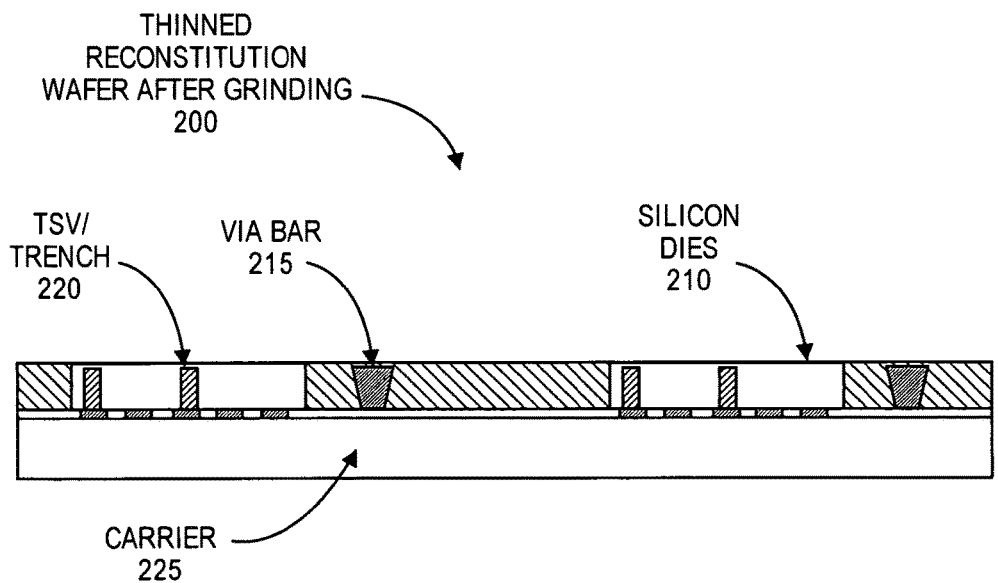
FIG. 3 is an illustration of a reconstitution wafer after grinding according to an embodiment.

FIG. 3 is an illustration of a reconstitution wafer after grinding according to an embodiment. In some embodiments of an apparatus or process, the reconstitution wafer (as illustrated in FIG. 2) is subjected to a grinding (thinning) process to a certain thickness to open any via bars 225 and any TSVs or metal filled trenches 220, resulting in thinned reconstitution layer 200. In some embodiments, after the grinding process for the thinned reconstitution wafer 230, the silicon dies and components 210 and any via bars 255 and TSVs or metal filled trenches 220 have a same height. For example, see FIG. 1, process P3 in element 120.

Figure 4A:
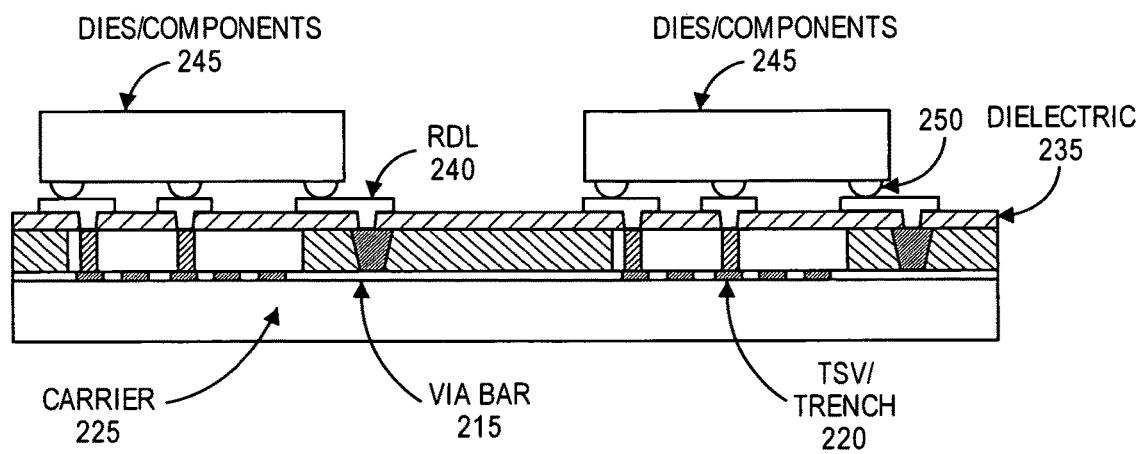
FIGS. 4A and 4B are illustrations of layering of components on a thinned reconstitution wafer according to an embodiment.
Figure 4B:
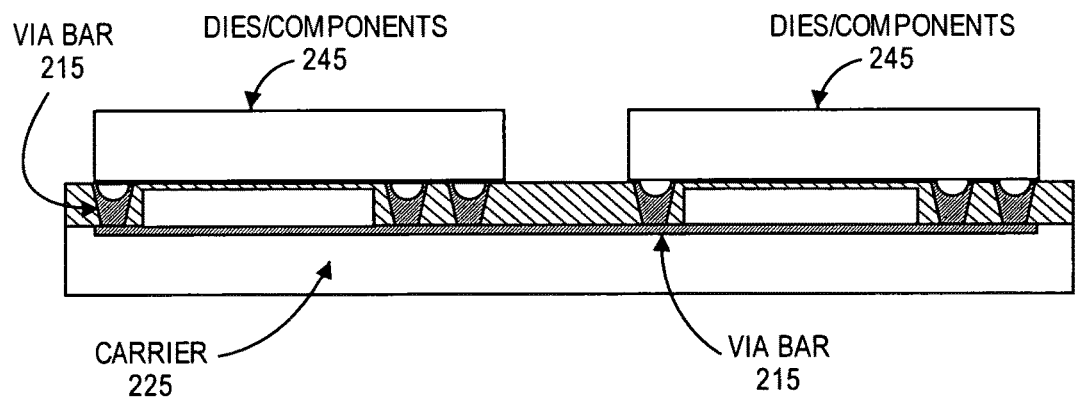

FIGS. 4A and 4B are illustrations of layering of components on a thinned reconstitution wafer according to an embodiment. In some embodiments, an apparatus or process includes application of a back side metallization, wherein the back side metallization may be a redistribution layer (RDL), pad, or interlayer metallization. For example, see FIG. 1, process P4 in element 125. In some embodiments, application of an RDL stack may further include application of a dielectric layer isolating the conductors of the RDL from the silicon surfaces exposed by grinding/thinning of the redistribution layer.

FIG. 4A illustrates a reconstitution layer with applied RDL metallization. In some embodiments, a thinned reconstitution wafer includes application of a dielectric 235 and RDL 240.

In some embodiments, an additional layer of components are to be stacked on top of the first build up layer. FIG. 4A further illustrates an embodiment in which additional components, shown as silicon dies and components 245, are installed on the RDL 240, the RDL providing redistribution of signals for the apparatus. In some embodiments of an apparatus or process, the components may be installed on the RDL layer using known technology, including, but not limited to, soldering of the components on to the RDL (using SOP (Solder on Pad), Cu-pillar (copper pillar), or solder bump technologies 250) or attaching the components to the RDL layer by thermocompression bonding.

FIG. 4B illustrates an alternative embodiment in which dies and components 245 are installed directly on via bars 215, on TSVs or metal filled trenches (not shown in FIG. 4B), or on a combination of such elements, such installation being made on bump contacts or other contacts. For example, see FIG. 1, process P5 in element 115.

Although not illustrated in FIGS. 4A and 4B, the dies and components 245 may include TSVs or metal filled trenches, and the installation may further include one or more via bars installed together with the silicon dies and components 245.

Figure 5A:
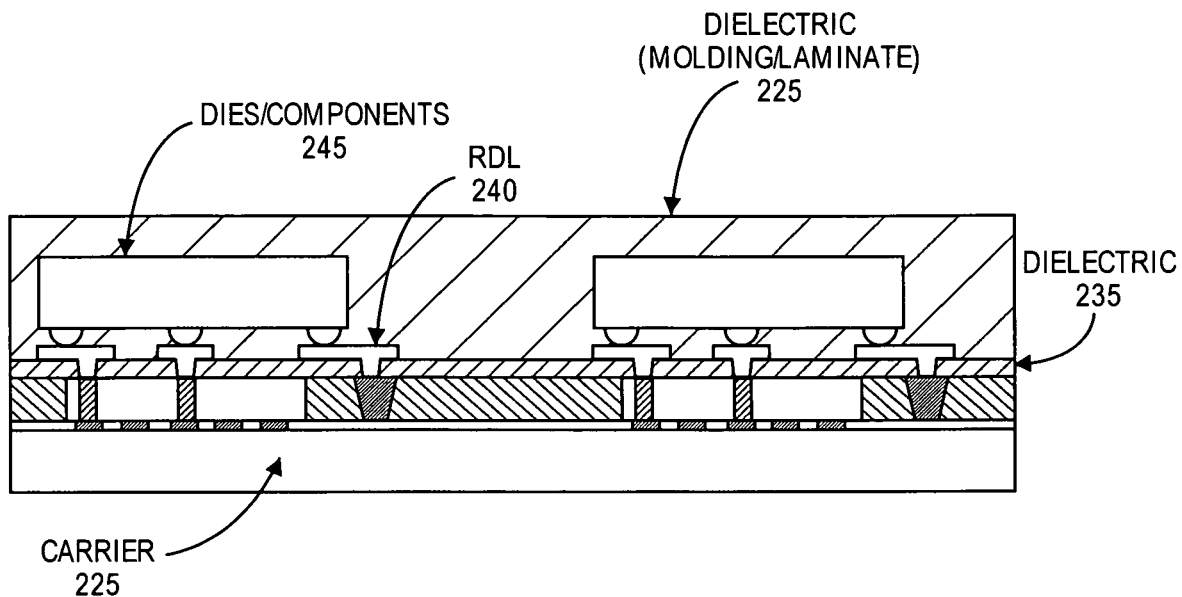
FIGS. 5A and 5B are illustrations of molding of components according to an embodiment.
Figure 5B:
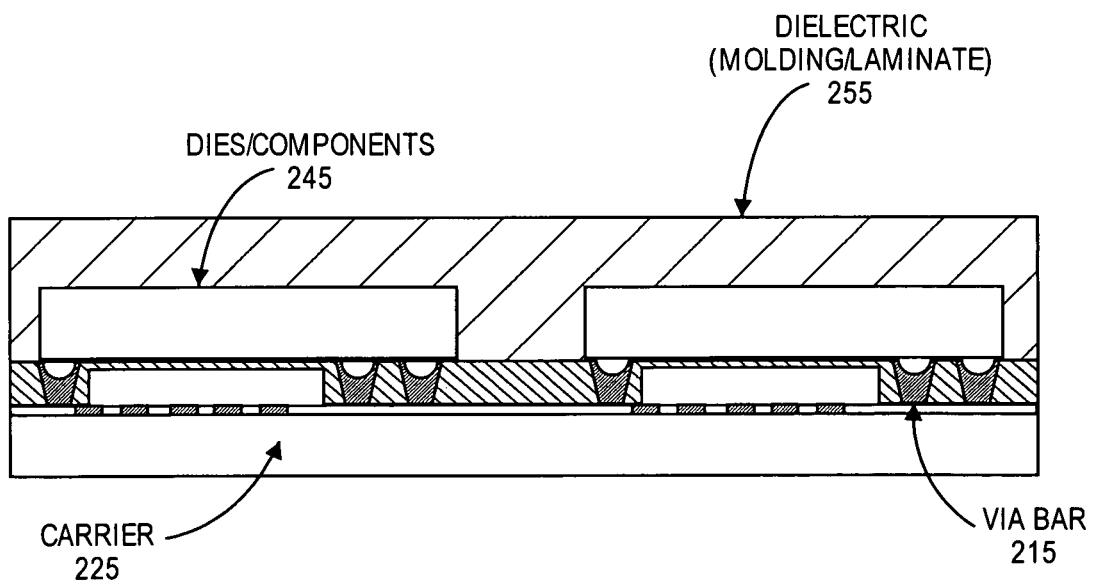

FIGS. 5A and 5B are illustrations of molding of components according to an embodiment. In some embodiments, subsequent to the installation of additional dies and components 245 (as illustrated in FIGS. 4A and 4B), the reconstitution wafer is subjected to a second molding process to provide dielectric (such as molding compound, laminate, or other dielectric material) 255 over the additional dies and components 245 to generate an additional stacked layer of the reconstitution wafer. For example, see FIG. 1, process P6 in element 115.

FIG. 5A illustrates an embodiment in which the components in the molding 255 are installed on the RDL 240, and FIG. 5B illustrates an alternative embodiment in which the dies and components 245 in the dielectric 250 are installed on via bars 215, on TSVs or metal filled trenches (not shown in FIG. 5B), or on a combination of such elements.

Figure 6A:
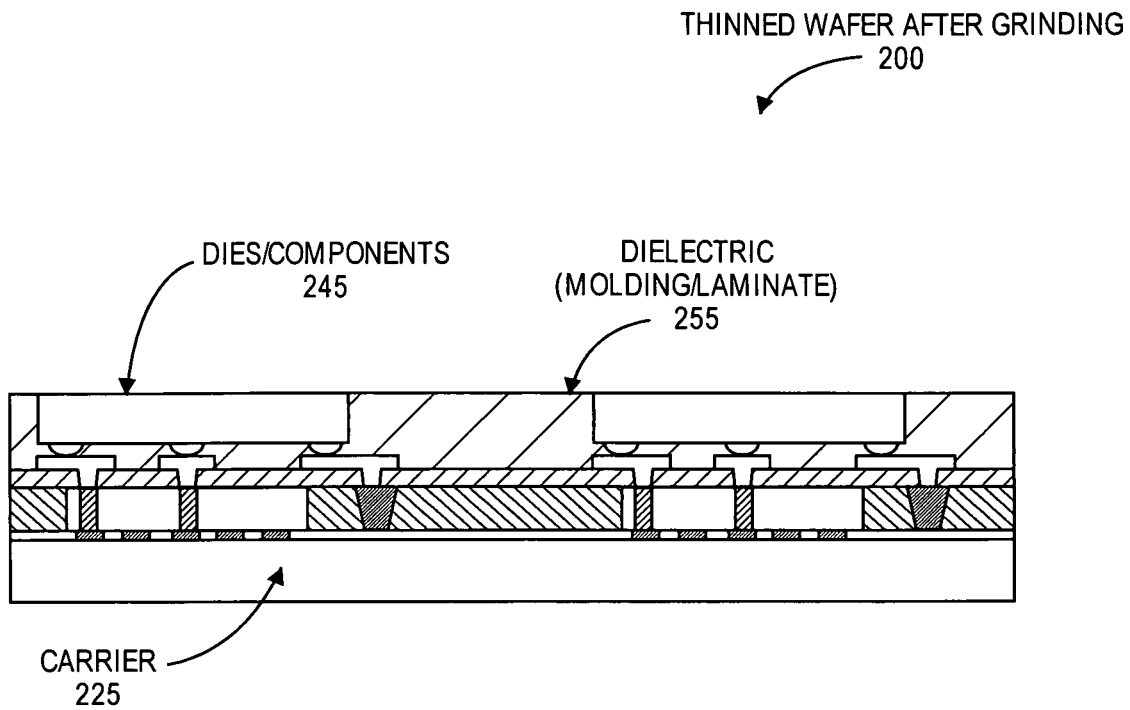
FIGS. 6A and 6B are illustrations of reconstitution wafer after grinding according to an embodiment.
Figure 6B:
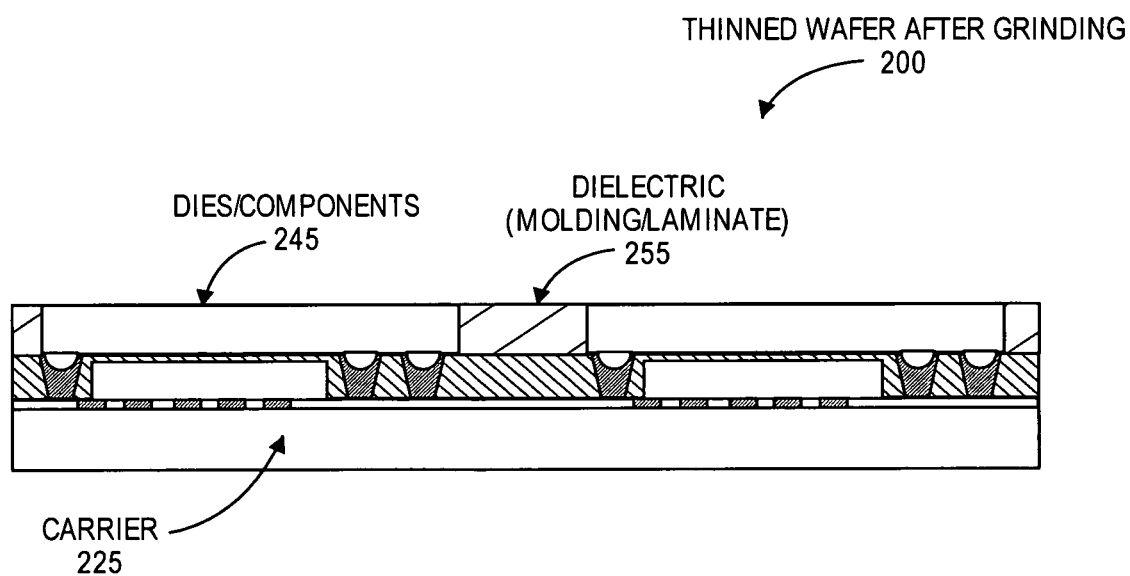

FIGS. 6A and 6B are illustrations of reconstitution wafers after optional grinding according to an embodiment. In some embodiments, a reconstitution wafer may be subjected to a second grinding (thinning) process subsequent to the second molding process (as illustrated in FIGS. 5A and 5B). In some embodiments, a reconstitution wafer is subjected to a grinding process if an addition al stacked layer is to be added to the reconstitution wafer.

In some embodiments, after the second grinding process for the thinned reconstitution wafer 200, the additional silicon dies and components 245 and any TSVs, metal filled trenches, or via bars (not shown in FIGS. 6A and 6B) have a same height. For example, see FIG. 1, process P7 in element 120.

FIG. 6A illustrates an embodiment in the thinned components in the dielectric 255 are installed on the RDL 240, and FIG. 6B illustrates an alternative embodiment in which the thinned components 245 in the molding 255 are installed on via bars 215, on TSVs or metal filled trenches (not shown in FIG. 6B), or on a combination of such elements.

Figure 7A:
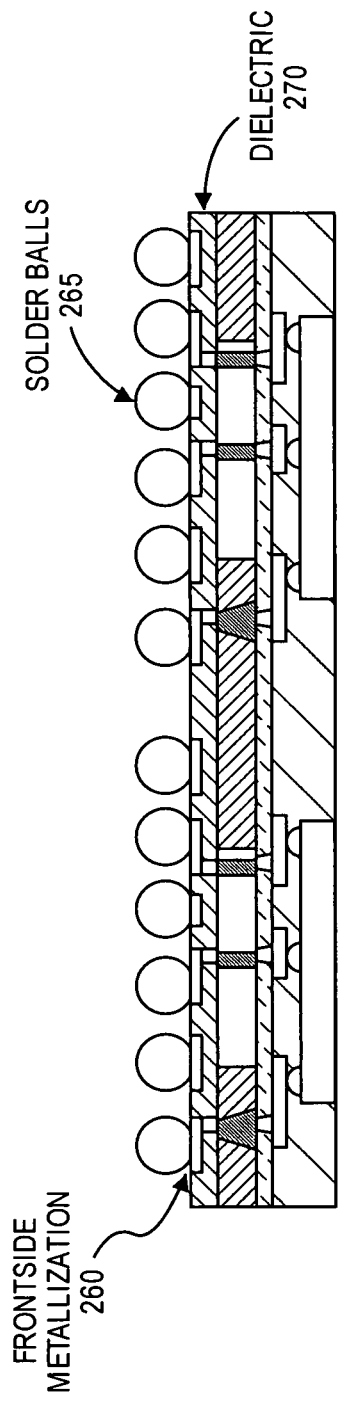
FIGS. 7A and 7B are illustrations of reconstitution wafer with front side metallization and carrier demounting according to an embodiment.
Figure 7B:
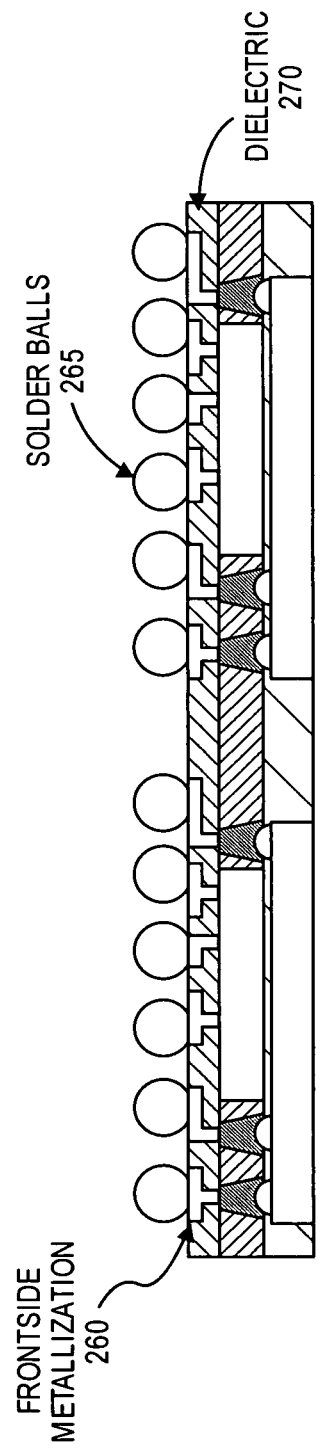

FIGS. 7A and 7B are illustrations of reconstitution wafers with front side metallization and carrier demounting according to an embodiment. In some embodiments, if there are additional layers to be fabricated, then the carrier is not demounted, with the process continuing with optional back side metallization, if needed, followed by the addition of new components, such as illustrated in FIGS. 4A and 4B.

In some embodiments, if there are no additional stacked layers to added to the reconstitution wafer, the reconstitution wafer is demounted from the carrier, see FIG. 1, process P9, element 130, and the reconstitution wafer 200 is inverted for applying front side metallization 260, pad opening, and solder ball application or similar technology 265. In some embodiments, the process may include application of a dielectric 270 to isolate the conductors of the front side metallization from the silicon surfaces exposed by grinding/thinning of the stacked layer of the redistribution wafer. See, for example, FIG. 1, processes P10 element 140 and P11 element 150.

In some embodiments, a back side metallization may further be applied to the back side of the final stacked layer of the reconstitution wafer, followed by application of solder ball contacts or similar technology.

Figure 8A:
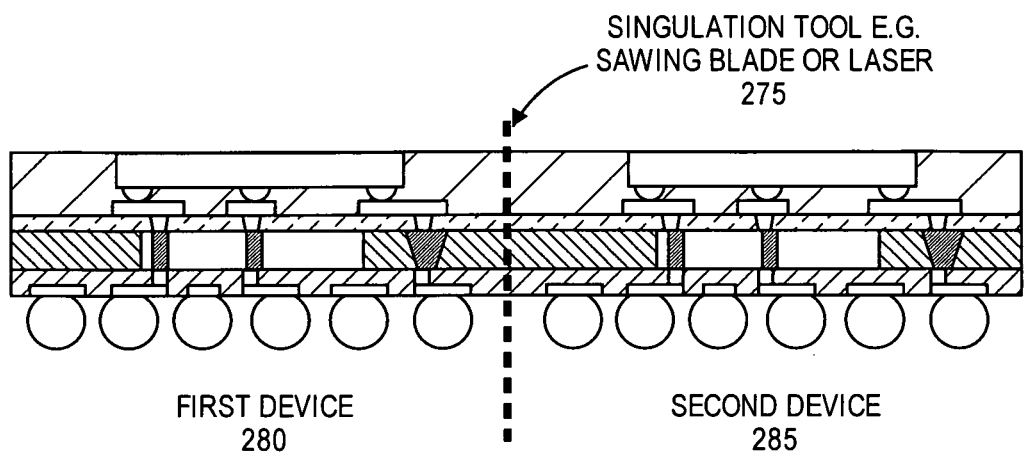
FIGS. 8A and 8B are illustrations of the singulation of a reconstitution wafer according to an embodiment.
Figure 8B:
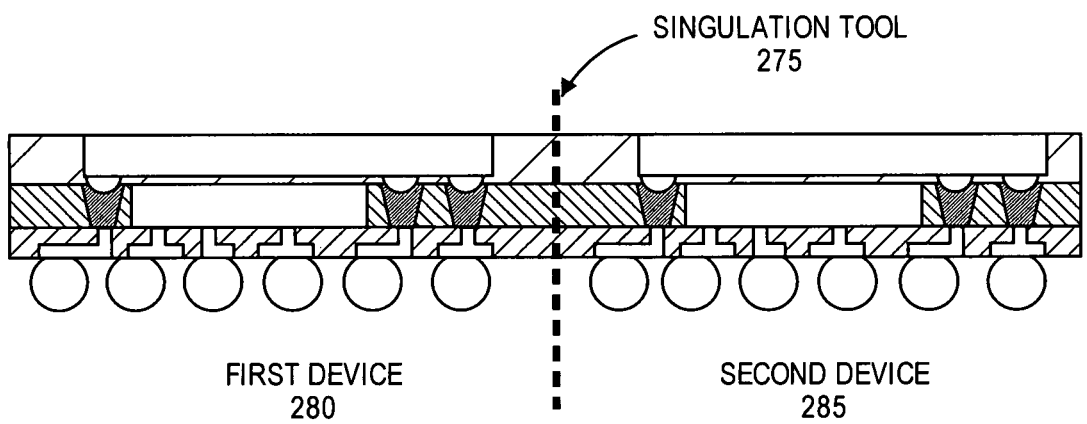

FIGS. 8A and 8B are illustrations of the singulation of a reconstitution wafer according to an embodiment. In some embodiments, upon completion of the attachment of the front side metallization and attachment of a ball grid array or similar connections, the reconstitution wafer may be separated (singulated) into separate devices using a singulation tool 275, which may include, but is not limited to, a saw blade or laser cutting apparatus. As a result of singulation, the die is singulated into a first device 280 and a second device 285.

Figure 9:
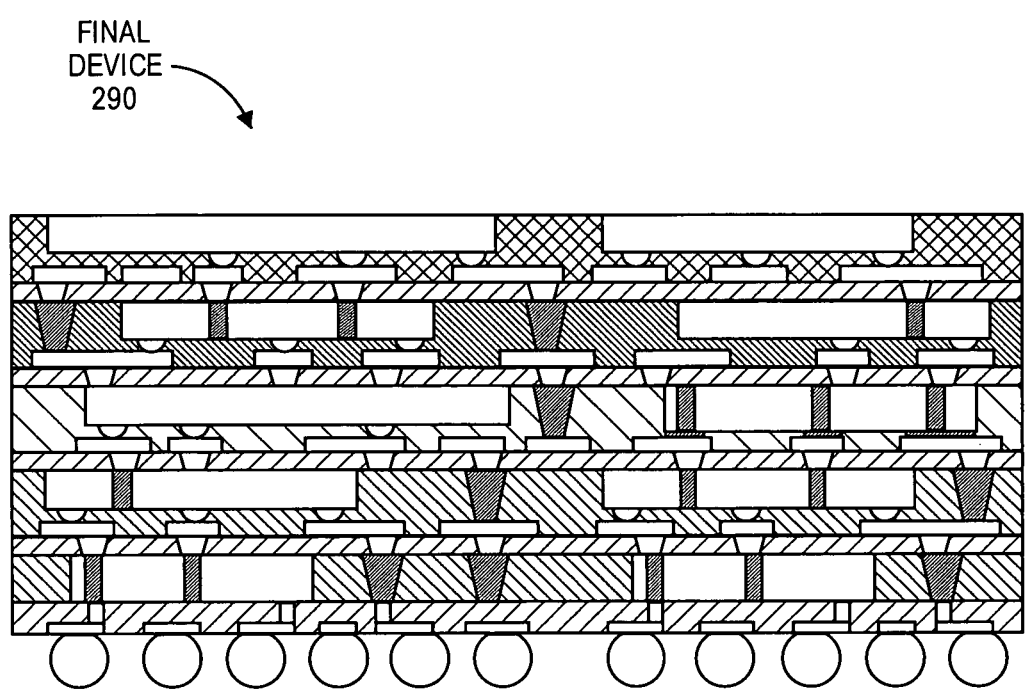
FIG. 9 is an illustration of a stacked package fabricated according to an embodiment.

FIG. 9 is an illustration of a stacked package fabricated according to an embodiment. In some embodiments, a resulting final device 290 is fabricated utilizing a process of added layers with chip to wafer bonding as illustrated in FIGS. 1A and 1B and as illustrated in further detail in FIGS. 2-8.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a device includes a first stacked layer including one or more semiconductor dies, components or both, the first stacked layer further including a first dielectric layer, the first stacked layer being thinned to a first thickness; and a second stacked layer of one or more semiconductor dies, components, or both, the second stacked layer further including a second dielectric layer, the second stacked layer being fabricated on the first stacked layer.

In some embodiments, the device further includes a metallization layer formed on a front side of the first stacked layer.

In some embodiments, the device further includes a ball grid array attached to the metallization layer formed on a front side of the first stacked layer.

In some embodiments, the device further includes a metallization layer formed on a back side of the first stacked layer, the second stacked layer being attached to the metallization layer formed on the first stacked layer.

In some embodiments, the first metallization layer is a redistribution layer (RDL).

In some embodiments, the first stacked layer includes a plurality of connections through the first stacked layer, wherein the plurality of connections includes a plurality of any combination of through silicon vias (TSVs), metal filled trenches, and via bars.

In some embodiments, the second stacked layer is attached to the plurality of connections.

In some embodiments, the device is one of a plurality of devices singulated from a stacked package.

In some embodiments, the second stacked layer is thinned to second thickness.

In some embodiments, the device further includes one or more additional stacked layers, each of the one or more additional stacked layers including one or more semiconductor dies, components, or both, each additional stacked layer further including a dielectric layer and being coupled to a previous layer that is thinned to a certain thickness.

In some embodiments, one or more of the first and second dielectric layers of the device include either molding compound or laminate.

In some embodiments, a method includes attaching one or more dies and components in a first stacked layer, a carrier being mounted to a front side of the first stacked layer; molding a first dielectric layer over the one or more dies and components of the first stacked layer; thinning the first stacked layer to a first thickness; attaching one or more dies and components in a second stacked layer; and molding a second dielectric layer over the one or more dies and components of the second stacked layer. In some embodiments, the first stacked layer and second stacked layer are each fabricated while the carrier is mounted to the front side of the first stacked layer.

In some embodiments, the method further includes unmounting the carrier from the front side of the first stacked layer; and forming a metallization layer on the front side of the first stacked layer.

In some embodiments, the method further includes attaching a ball grid array to the metallization layer on the front side of the first stacked layer.

In some embodiments, the method further includes forming a metallization layer on a back side of the first stacked layer, the one or more dies and components of the second stacked layer being attached to the metallization layer.

In some embodiments, attaching the one or more dies and components in the first stacked layer includes a plurality of connections through the first stacked layer, the plurality of connections including a plurality of any combination of through silicon vias (TSVs), metal filled trenches, and via bars, the second stacked layer being attached to the plurality of connections.

In some embodiments, the first stacked layer and second stacked layer are included in a stacked package, and further comprising singulating the stacked package to generate a first device and a second device.

In some embodiments, the method further includes thinning the second stacked layer to a second thickness.

In some embodiments, the method further includes fabricating one or more additional stacked layers, each of the one or more additional stacked layers including one or more semiconductor dies, components, or both, each additional stacked layer further including a dielectric layer and being coupled to a layer that is thinned to a certain thickness.

In some embodiments, molding the first dielectric layer over the one or more dies and components of the first stacked layer creates a reconstitution wafer, and wherein the second stacked layer is an extension of the reconstitution wafer.

In some embodiments, no stacked layer is handled without the carrier being mounted to the first stacked layer.

In some embodiments, a stacked package includes a first stacked layer, wherein the first stacked layer includes one or more semiconductor dies, components, or both, and includes a first dielectric layer, and the first stacked layer is thinned to a first thickness; one or more additional stacked layers, wherein each additional stacked layer includes one or more semiconductor dies, components, or both and a dielectric layer, and each additional stacked layer is attached to a previous stacked layer by chip to wafer bonding, the previous stacked layer being thinned to a certain thickness; a metallization layer formed on a front side of the first stacked layer; and a ball grid array attached to the metallization layer.

In some embodiments, each additional stacked layer is attached to the previous stacked layer by either a metallization layer formed on the previous stacked layer; or a plurality of connections through the previous stacked layer.

In some embodiments, the plurality of connections includes a plurality of any combination of through silicon vias (TSVs), metal filled trenches, and via bars.

In some embodiments, the dielectric layer of a final stacked layer of the stacked layers of the stacked package is molding compound or laminate.

In some embodiments, each stacked layer of the stacked package is a layer fabricated while a carrier is mounted to the first stacked layer.

What is claimed is:

1. A device comprising:
  a first stacked layer including one or more semiconductor dies, components or both, the first stacked layer further including a first dielectric layer, the first stacked layer being thinned to a first thickness;
  a second stacked layer including one or more semiconductor dies, components or both, the second stacked layer further including a second dielectric layer, the second stacked layer being fabricated on the first stacked layer, wherein the second dielectric layer is not vertically in between the one or more semiconductor dies, components or both of the first stacked layer and the one or more semiconductor dies, components or both of the second stacked layer;
  a first via bar in the first dielectric layer, the first via bar laterally spaced apart from a first lateral sidewall of the one or more semiconductor dies, components or both of the first stacked layer, wherein the first via bar extends above a top of the one or more semiconductor dies, components or both of the first stacked layer, and wherein the first via bar does not extend below a bottom of the first dielectric layer; and
  a second via bar in the first dielectric layer, the second via bar laterally spaced apart from a second lateral sidewall of the one or more semiconductor dies, components or both of the first stacked layer, wherein the second via bar extends above the top of the one or more semiconductor dies, components or both of the first stacked layer, and wherein the second via bar does not extend below the bottom of the first dielectric layer.

2. The device of claim 1, further comprising a metallization layer formed on a front side of the first stacked layer.

3. The device of claim 2, further comprising a ball grid array attached to the metallization layer formed on a front side of the first stacked layer.

4. The device of claim 1, further comprising a metallization layer formed on a back side of the first stacked layer, the second stacked layer being attached to the metallization layer formed on the first stacked layer.

5. The device of claim 4, wherein the first metallization layer is a redistribution layer (RDL).

6. The device of claim 1, wherein the first stacked layer includes a plurality of connections through the first stacked layer, wherein the plurality of connections includes a plurality of any combination of through silicon vias (TSVs), metal filled trenches, and via bars.

7. The device of claim 6, wherein the second stacked layer is attached to the plurality of connections.

8. The device of claim 1, wherein the device is one of a plurality of devices singulated from a stacked package.

9. The device of claim 1, wherein the second stacked layer is thinned to second thickness.

10. The device of claim 9, further comprising one or more additional stacked layers, each of the one or more additional stacked layers including one or more semiconductor dies, components, or both, each additional stacked layer further including a dielectric layer and being coupled to a previous layer that is thinned to a certain thickness.

11. The device of claim 1, wherein one or more of the first and second dielectric layers of the device include either molding compound or laminate.

12. A stacked package comprising:
a first stacked layer, wherein:
the first stacked layer includes one or more semiconductor dies, components or both, and includes a first dielectric layer,
the first stacked layer is thinned to a first thickness; and
the first stacked layer comprising:
a first via bar in the first dielectric layer, the first via bar laterally spaced apart from a first lateral sidewall of the one or more semiconductor dies, components or both of the first stacked layer, wherein the first via bar extends above a top of the one or more semiconductor dies, components or both of the first stacked layer, and wherein the first via bar does not extend below a bottom of the first dielectric layer; and
a second via bar in the first dielectric layer, the second via bar laterally spaced apart from a second lateral sidewall of the one or more semiconductor dies, components or both of the first stacked layer, wherein the second via bar extends above the top of the one or more semiconductor dies, components or both of the first stacked layer, and wherein the second via bar does not extend below the bottom of the first dielectric layer; and
one or more additional stacked layers, wherein:
each additional stacked layer includes one or more semiconductor dies, components or both, and includes a dielectric layer, wherein the dielectric layer of a first of the additional stacked layers is not vertically in between the one or more semiconductor dies, components or both of the first stacked layer and the one or more semiconductor dies, components, or both of the first of the additional stacked layers, and
each additional stacked layer is attached to a previous stacked layer by chip to wafer bonding, the previous stacked layer being thinned to a certain thickness;
a metallization layer formed on a front side of the first stacked layer; and
a ball grid array attached to the metallization layer.

13. The stacked package of claim 12, wherein each additional stacked layer is attached to the previous stacked layer by either:
a metallization layer formed on the previous stacked layer; or
a plurality of connections through the previous stacked layer.

14. The stacked package of claim 13, wherein the plurality of connections includes a plurality of any combination of through silicon vias (TSVs), metal filled trenches, and via bars.

15. The stacked package of claim 12, wherein the dielectric layer of a final stacked layer of the stacked layers of the stacked package is molding compound or laminate.

16. A package, comprising:
a die having a first side and a second side, the second side opposite the first side, and the die having a first lateral sidewall and a second lateral sidewall;
a first molding layer laterally adjacent to the first and second lateral sidewalls of the die, the first molding layer having an uppermost surface above the second side of the die;
a first via bar in the first molding layer, the first via bar laterally spaced apart from the first lateral sidewall of the die, wherein the first via bar extends above the second side of the die, and wherein the first via bar does not extend below a bottom of the first molding layer;
a second via bar in the first molding layer, the second via bar laterally spaced apart from the second lateral sidewall of the die, wherein the second via bar extends above the second side of the die, and wherein the second via bar does not extend below the bottom of the first molding layer;
a component over the die, the component above the uppermost surface of the first molding layer, the component having a first side and a second side above the first side, and the component having a first lateral sidewall and a second lateral sidewall, wherein the first side of the component faces toward the die, and the second side of the component faces away from the die;
a second molding layer laterally adjacent to the first and second lateral sidewalls of the component, and the second molding layer over the second side of the component, wherein the second molding layer is distinct from the first molding layer, wherein the second molding layer is not on the first side of the component;
a first solder bump attached to the first via bar, the first solder bump electrically coupled to the component; and
a second solder bump attached to the second via bar, the second solder bump electrically coupled to the component.

17. The package of claim 16, wherein the first solder bump is directly attached to the first via bar, and the second solder bump is directly attached to the second via bar.

18. The package of claim 16, wherein the first via bar and the second via bar extend entirely through the first molding layer.

* * * * *